United States Patent
Philip et al.

(10) Patent No.: US 11,133,058 B1
(45) Date of Patent: Sep. 28, 2021

(54) ANALOG COMPUTING ARCHITECTURE FOR FOUR TERMINAL MEMORY DEVICES

(71) Applicant: International Business Machines Corporation, Armonk, NY (US)

(72) Inventors: Timothy Mathew Philip, Albany, NY (US); Kevin W. Brew, Albany, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/851,455

(22) Filed: Apr. 17, 2020

(51) Int. Cl.
| G11C 16/10 | (2006.01) |
| G11C 11/54 | (2006.01) |
| G11C 13/00 | (2006.01) |
| G06N 3/063 | (2006.01) |

(52) U.S. Cl.
CPC .............. G11C 11/54 (2013.01); G06N 3/063 (2013.01); G11C 13/003 (2013.01); G11C 13/004 (2013.01); G11C 13/0026 (2013.01); G11C 13/0028 (2013.01); G11C 13/0069 (2013.01); *G11C 13/0004* (2013.01); *G11C 2213/79* (2013.01)

(58) Field of Classification Search
CPC ... G11C 16/044; G11C 11/54; G11C 13/0069; G11C 13/003; G11C 13/004; G11C 5/06; G11C 16/04; G11C 16/06; G11C 16/10
See application file for complete search history.

(56) References Cited

U.S. PATENT DOCUMENTS

| 8,471,236 | B2 | 6/2013 | Breitwisch et al. |
| 8,546,861 | B2 | 10/2013 | Hwang |
| 9,570,169 | B1 | 2/2017 | Czornomaz et al. |
| 9,613,689 | B1* | 4/2017 | Takaki ............... G11C 13/0026 |
| 9,767,407 | B2 | 9/2017 | Cho et al. |
| 10,248,907 | B2 | 4/2019 | Gokmen et al. |
| 10,380,485 | B2 | 8/2019 | Gokmen et al. |
| 2018/0293487 | A1 | 10/2018 | Copel et al. |
| 2019/0042928 | A1* | 2/2019 | Young .................. G06N 3/0454 |
| 2019/0180185 | A1* | 6/2019 | Sun ........................ G06N 3/084 |

(Continued)

OTHER PUBLICATIONS

M. Yu et al., "Novel Vertical 3D Structure of TaO x-based RRAM with Self-localized Switching Region by Sidewall Electrode Oxidation," Scientific Reports, Feb. 17, 2016, pp. 1-10, vol. 6, No. 21020.

(Continued)

*Primary Examiner* — Hien N Nguyen
(74) *Attorney, Agent, or Firm* — Randall Bluestone; Ryan, Mason & Lewis, LLP

(57) ABSTRACT

A multiterminal non-volatile memory cross-bar array system includes a set of conductive row rails, a set of conductive column rails configured to form a plurality of crosspoints at intersections between the conductive rails and the conductive column rails and a resistive processing unit at each of the crosspoints each representing a neuron in a neural network. At least one given conductive row rail includes first and second row lines is in contact with a given resistive processing unit. At least one given conductive column rail including first and second column lines is in contact with the given resistive processing unit.

20 Claims, 4 Drawing Sheets

(56) References Cited

U.S. PATENT DOCUMENTS

2020/0410333 A1* 12/2020 Das .......................... G06N 3/04

OTHER PUBLICATIONS

S. Dutta et al., "Leaky Integrate and Fire Neuron by Charge-Discharge Dynamics in Floating-Body MOSFET," Scientific Reports, Aug. 15, 2017, pp. 1-7, vol. 7, No. 8257.
D. Soudry et al., "Memristor-Based Multilayer Neural Networks With Online Gradient Descent Training," IEEE Transaction on Neural Networks and Learning Systems, Oct. 10, 2015, pp. 2408-2421, vol. 26, No. 10.

* cited by examiner

ANALOG COMPUTING ARCHITECTURE FOR FOUR TERMINAL MEMORY DEVICES

BACKGROUND

The present invention relates generally to computing architectures for an artificial neural network (ANN), and, in particular, to a multiterminal cross-bar array system for neuromorphic or artificial intelligence computing in conjunction with an ANN.

Artificial neural networks (ANNs) can be formed from cross-bar arrays of resistive processing units (RPUs) that provide local data storage and local data processing. Cross-bar arrays are high density, low cost circuit architectures used to form a variety of electronic circuits and devices, including ANN architectures, neuromorphic microchips and ultra-high density nonvolatile memory devices. A basic cross-bar array configuration includes a set of conductive row wires and a set of conductive column wires formed to intersect the set of conductive row wires. The intersections between the two sets of wires are separated by cross-point memory devices. Trainable resistive memory cross-point devices are referred to as resistive processing unit (RPU) cells. RPU cells are considered as a promising technology for electronic synapse devices or memristors for neuromorphic computing as well as high-density and high-speed non-volatile memory applications. For example, in neuromorphic computing applications, an RPU cell can be used as a connection (synapse) between a pre-neuron and post-neuron, representing the connection weight in the form of device resistance. Multiple pre-neurons and post-neurons can be connected through a cross-bar array of the RPU cells, which naturally expresses a fully-connected neural network.

SUMMARY

In an illustrative embodiment, a non-volatile memory cross-bar array system comprises a set of conductive row rails, a set of conductive column rails configured to form a plurality of crosspoints at intersections between the conductive rails and the conductive column rails, and a resistive processing unit at each of the crosspoints each representing a neuron in a neural network. At least one given conductive row rail includes first and second row lines in contact with a given resistive processing unit. At least one given conductive column rail includes first and second column lines in contact with the given resistive processing unit.

In another illustrative embodiment, a non-volatile memory cross-bar array system comprises a set of conductive row rails and a set of conductive column rails configured to form a plurality of crosspoints at intersections between the conductive rails and the conductive column rails. Each conductive rail includes a pair of row lines and each column rail includes a pair of column lines. The cross-bar array system further includes a matrix of resistive processing unit cells. Individual resistive processing unit cells are disposed at the crosspoints to electrically couple with respective row rails and column rails. A given resistive processing unit cell comprises a four terminal memory device.

In another illustrative embodiment, a non-volatile memory cross-bar array system comprises a set of conductive row rails, a set of conductive column rails configured to form a plurality of crosspoints at intersections between the conductive rails and the conductive column rails, and a resistive processing unit at each of the crosspoints representing a neuron in a neural network. At least one given conductive row rail includes a row write line and a row read line in contact with a given resistive processing unit. At least one given conductive column rail includes a column write line and a column read line in contact with the given resistive processing unit. The row write line and the column write line comprise a first material having a first level of resistivity. The row read line and the column read line comprise a second material having a second level of resistivity less than the first level.

DETAILED DESCRIPTION

Figure 1:
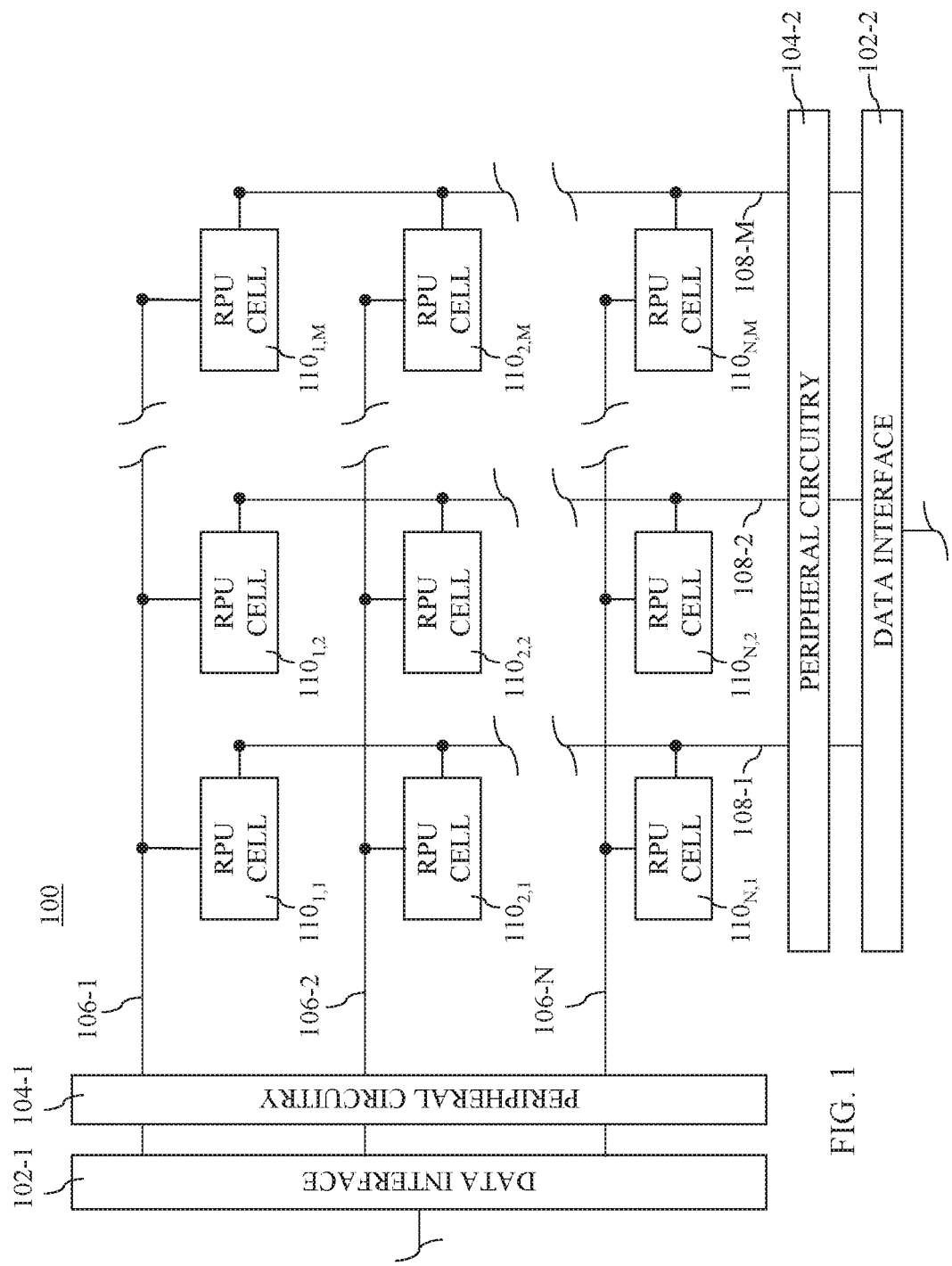
FIG. 1 is a schematic diagram illustrating an example neuromorphic device architecture according to an illustrative embodiment of the invention.

The present invention relates in general to a semiconductor device. More specifically, the present invention relates to an analog computing architecture having application for use in artificial neural networks (ANNs). The computing architecture is formed from cross-bar arrays of multi-terminal resistive processing units (RPUs) that provide local data storage and local data processing to facilitate implementation of artificial intelligence algorithms for matrix inversion, matrix decomposition and the like.

In the following discussion, the term "illustrative" is used herein to mean "serving as an example, instance or illustration." Any embodiment or design described herein is intended to be "illustrative" and is not necessarily to be construed as preferred or advantageous over other embodiments or designs. The term "connection" or "connected" can include both an indirect "connection" and a direct "connection." The terms "on" or "onto" with respect to placement of components relative to the semiconductor structure or stack are not to be interpreted as requiring direct contact of the components for it is possible one or more intermediate components, layers or coatings may be positioned between the select components unless otherwise specified. More specifically, positional relationships, unless specified otherwise, can be direct or indirect, and the present invention is not intended to be limiting in this respect.

ANNs are often embodied as "neuromorphic" systems of interconnected processor elements that act as simulated "neurons" and exchange "messages" between each other in the form of electronic signals. Similar to the "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

Resistive processing units (RPU) cells, in effect, function as the ANN's weighted connections between neurons. Nanoscale two-terminal devices, for example, memristors having "ideal" conduction state switching characteristics, are often used as the RPU cells coupled to a cross-bar array to emulate synaptic plasticity with high energy efficiency. The conduction state (e.g., resistance) of the ideal memristor material can be altered by controlling the voltages applied between individual wires of the row and column wires. Digital data can be stored by alteration of the conduction state of the memristor material at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target RPU cells.

Although current cross-bar array systems with RPU cells show great promise as components of computing architectures, these devices are subject to some inherent disadvantages which detract from their overall usefulness in ANN applications. For example, current RPU cells are only two terminal memory devices which suffer from issues such as leakage drift. The presence of drift affects the accuracy of the artificial intelligence algorithm executed in connection with the ANN application, particularly, over increased time periods. Current drift also results in limited array size and large power consumption, which significantly degrades performance of an array. In addition, non-linearity issues associated with conventional RPU circuits impact programming of the RPU cells.

Accordingly, the present invention is directed to a cross-bar array system having multi-terminal RPU cells configured to mitigate drift and improve linearity. In illustrative embodiments, the cross-bar array system incorporates multiple rails for each level coupled to a single RPU cell whereby the RPU cell, in effect, is a four-terminal device.

Referring now to FIG. 1, one illustrative neuromorphic or computer architecture that incorporates the cross-bar array system of the present disclosure is illustrated. FIG. 1 is a diagram of a two-dimensional (2D) cross-bar array that performs forward matrix multiplication, backward matrix multiplication and weight updates according to the present disclosure. The exemplative neuromorphic device architecture 100 comprises data interfaces 102-1 and 102-2, peripheral circuits 104-1 and 104-2, conductive row control lines or rails 106-1, 106-2 ... 106-N, and conductive column control lines or rails 108-1, 108-2 ... 108-M. A matrix of RPU cells $110_{1,1}$, $110_{1,2}$ ... $110_{1,M}$, $110_{2,1}$, $110_{2,2}$ ... $110_{2,M}$, ... $110_{N,1}$, $110_{N,2}$ ... $110_{N,M}$ is connected to the row control rails 106 and column control rails 108 where each RPU cell is connected to one of the row control rails 106 and one of the column control rails 108. For example, RPU cell $110_{1,1}$ is connected to row control rail 106-1 and column control rail 108-1. Such an example architecture is sometimes referred to as a 2D cross-bar array. In some embodiments, neuromorphic device architecture 100 may also comprise reference circuitry (not shown) which comprises various types of circuit blocks such as power, clock, bias and timing circuitry to provide power distribution, control signals and clocking signals for operation of the neuromorphic device architecture 100.

In some embodiments, the neuromorphic device architecture 100 is configured to perform ANN computations wherein a conductance of each RPU cell 110 represents a matrix element or weight, which can be updated or accessed through operations of the peripheral circuits 104. Training generally relies on a backpropagation process which comprises three repeating cycles: a forward cycle, a backward cycle, and a weight update cycle. The neuromorphic device architecture 100 can be configured to perform all three cycles of the backpropagation process in parallel, thus potentially providing significant acceleration in training with lower power and reduced computation resources.

The programmable resistive RPU cells provide local data storage functionality and local data processing functionality. In other words, when performing data processing, the value stored at each RPU is permanently stored, which eliminates the need to move relevant data in and out of a processor and a separate storage element. Additionally, the local data storage and local data processing provided by the described embodiments accelerate the ANN's ability to implement algorithms such as matrix inversion, matrix decomposition and the like. Accordingly, implementing a machine learning ANN architecture having the described RPU enables the implementation that optimizes speed, efficiency and power consumption of the ANN. The described RPU and resulting ANN architecture improve overall ANN performance and enable a broader range of practical ANN applications.

In some embodiments, the RPU cells 110 can be implemented using variable resistance devices or memristor devices such as resistive random-access memory (RRAM) devices, phase change memory (PCM) devices, programmable cell (PMC) memory devices, etc. In other embodiments, the RPU cells 110 can be implemented using an analog CMOS framework comprising a capacitor and one or more read transistors, wherein the capacitor serves as a memory element in the RPU cell which stores a weight value in the form of capacitor voltage. The capacitor voltage is directly applied to the gate terminal(s) of the read transistor(s) to modulate the channel resistance of the read transistor(s). The charge state stored in the capacitor can be accessed by applying a small bias across the read transistor(s) to generate drain currents, which generate a read current that flows out of RPU cell. The RPU cells are configured to implement algorithms, for example artificial intelligence (AI) algorithms, or other functions. In applications, fast and scalable architectures for matrix operations (e.g., inversion, multiplications, etc.) with the RPU cells can be achieved.

In FIG. 1, the conductive row control rails 106 and the conductive column control rails 108 are each shown in FIG. 1 as a single line for ease of initial illustration; however, in accordance with exemplative embodiments of the present disclosure, at least some of the row control rails and the column control rails include two or more individual lines with a first of the individual line performing a write/update function and a second of an individual line performing a read function. More specifically, in illustrative embodiments, each row control rail 106 and each column control rail 108 comprises a pair of control lines, including a "read" control line, and an "update/write" control line, wherein the cell conductance (e.g., weight value) of a given RPU cell 110 can be adjusted and sensed through the write/update and read control lines, respectively, for a given row and column connected to the given RPU cell 110. Furthermore, in conjunction with the multiline approach for read and write functionalities, the cross-bar array system of the present disclosure is configured to provide multiterminal RPU cells, e.g., at least one or more RPU cells has four terminals. These features provide significant advantages as will be discussed in further detail hereinbelow.

Figure 2:
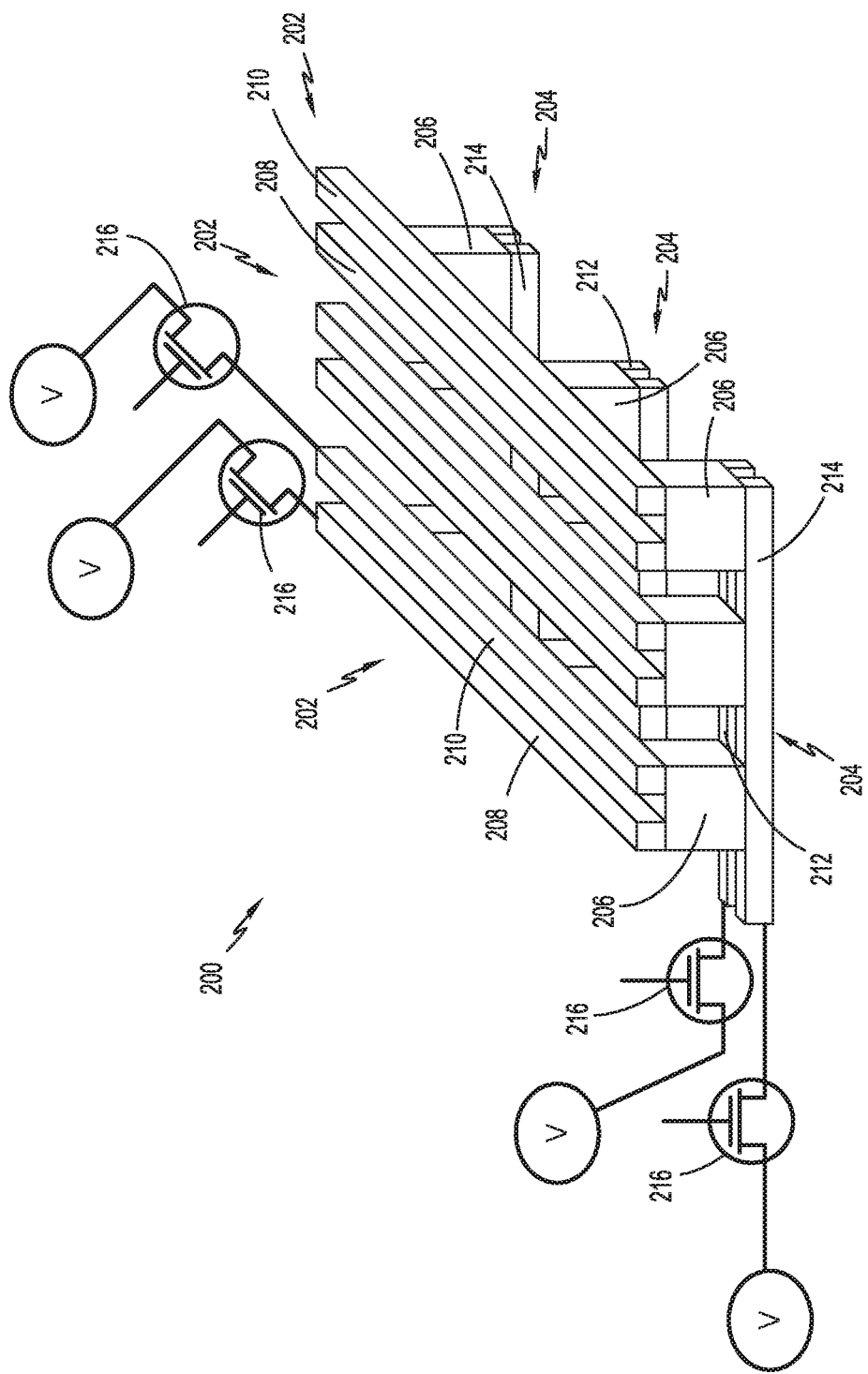
FIG. 2 is a schematic view of an illustrative embodiment of a cross-bar array system for use with the neuromorphic device architecture of FIG. 1.

Referring now to FIG. 2, one illustrative embodiment of the cross-bar array system for use with the neuromorphic or computer architecture 100 represented in FIG. 1 of the present disclosure is illustrated. The cross-bar array system 200 includes a plurality or set of conductive row rails 202, a plurality or set of conductive column rails 204 and a matrix of RPU cells 206 at vertical cross-points of the row and column rails 202, 204. The conductive row rails 202 and the conductive column rails 204 are arranged in general orthogonal relation. Each conductive row rail 202 includes a first row line 208 and a second row line 210 arranged in parallel relation and in electrical contact with upper surfaces of respective RPU cells 206. In illustrative embodiments, the first row line 208 is a write/modify line (hereinafter, "row write line 208") and the second row line 210 is a read line (hereinafter "row read line 210"). Similarly, each conductive column rail 204 includes a first column line 212 and a second column line 214 arranged in parallel relation and in electrical contact with the lower surface of respective RPU cells 206. In illustrative embodiments, the first column line 212 is a write/modify line (hereinafter, "column write line 212") and the second row line 214 is a read line (hereinafter "column read line 214"). The cross-bar system 200 further includes a transistor 216 electrically coupled to each of the row write and row read lines 208, 210 and to each of the column write and column read lines 212, 214. In illustrative embodiments, the transistors 216 may be nMOS transistors, but pMOS transistors are also envisioned.

In FIG. 2, only three row rails 202 and three column rails 204 are disclosed. It is appreciated that the cross-bar system 200 may have hundreds of row and column rails 202, 204 with associated RPU cells 206. One or more of the rows and column rails 202, 204 may include the pairs of respective row write and read lines 208, 210 and the column write and column read lines 212, 214. In illustrative embodiments, all of the row and column rails 202, 204 include the pairs of write and read lines. In addition, the cross-bar array system 200 is depicted as a two (2) dimensional array. It is envisioned that the array may be multidimensional including three (3) dimensional stacking. The RPU cell 206 of the cross-bar system 200 provides a four terminal device defined by the respective couplings of the row write and row read lines 208, 210 and the column write and column read lines 212, 214 with respective ones of the RPU cells 206. The four terminal device may provide enhanced flexibility to the computer architecture.

The use of the cross-bar system 200 of FIG. 2 will now be described. One or more voltage sources with accompanying logic or circuitry, represented schematically as "V," are coupled to each of the row write and read lines 208, 210 and the column write and column read lines 212, 214, associated with one or more RPU cells 206. In FIG. 2, voltage sources "V" are shown coupled to only one row rail 202 and one column rail 204 for illustrative purposes. In applications, one or more voltage sources "V" would be coupled to each row rail 202 and column rail 204. The voltage characteristic of the RPU cell 206 is determined. In general, the $V_{SELECT}$ is the minimum voltage which if exceeded, i.e., if $V > V_{SELECT}$, would change the internal resistance state of the RPU cell 206. The $V_{SELECT}$ may be a positive or negative voltage depending on the application. In conjunction with performing a write or modify function to the RPU cell 206, the transistors 216 coupled to each of the row read line 210 and the column read line 214 are set to an "off" or "clamp" position (e.g., V=0) preventing current from passing through these read lines 210, 214. The transistors 216 coupled to the row write line 208 and/or the column write line 212 are set to an "open" state. The voltage sources are set, for example, to apply a bias application of voltage $V > V_{SELECT}$ to the row write line 208 and/or the column write line 212 to deliver a current through the write lines 208, 212 and perform a write function on the respective RPU cell 206. No current flows through the row read and column read lines 210, 214. Similarly, in conjunction with performing a read function, the transistors 216 associated with the row and/or column write lines 208, 212 are set to an "off" state to close off the circuit leading to the row and column write lines 208, 212. The transistors 216 coupled to the row read line 210 and/or the column read line 214 are set to an "on" state. A bias voltage, which in illustrative embodiments is 0.1-0.9 $V_{SELECT}$, is applied to the row read and column read lines 210, 214 to deliver a current and perform a read function on the respective RPU cells 206.

The cross-bar system 200 thus substantially minimizes cross-talk between the row and column write lines 208, 212 and the row and column read lines 210, 214. Moreover, the ability to selectively close the row and column read lines 210, 214 when performing a write function and close the row and column write lines 208, 212 when performing a read function, via control of the respective transistors 216, advantageously reduces any cross-talk between the lines. This produces an RPU circuit having highly linear and symmetric programming properties which is significant for successful implementation in practical ANNs.

Figure 3:
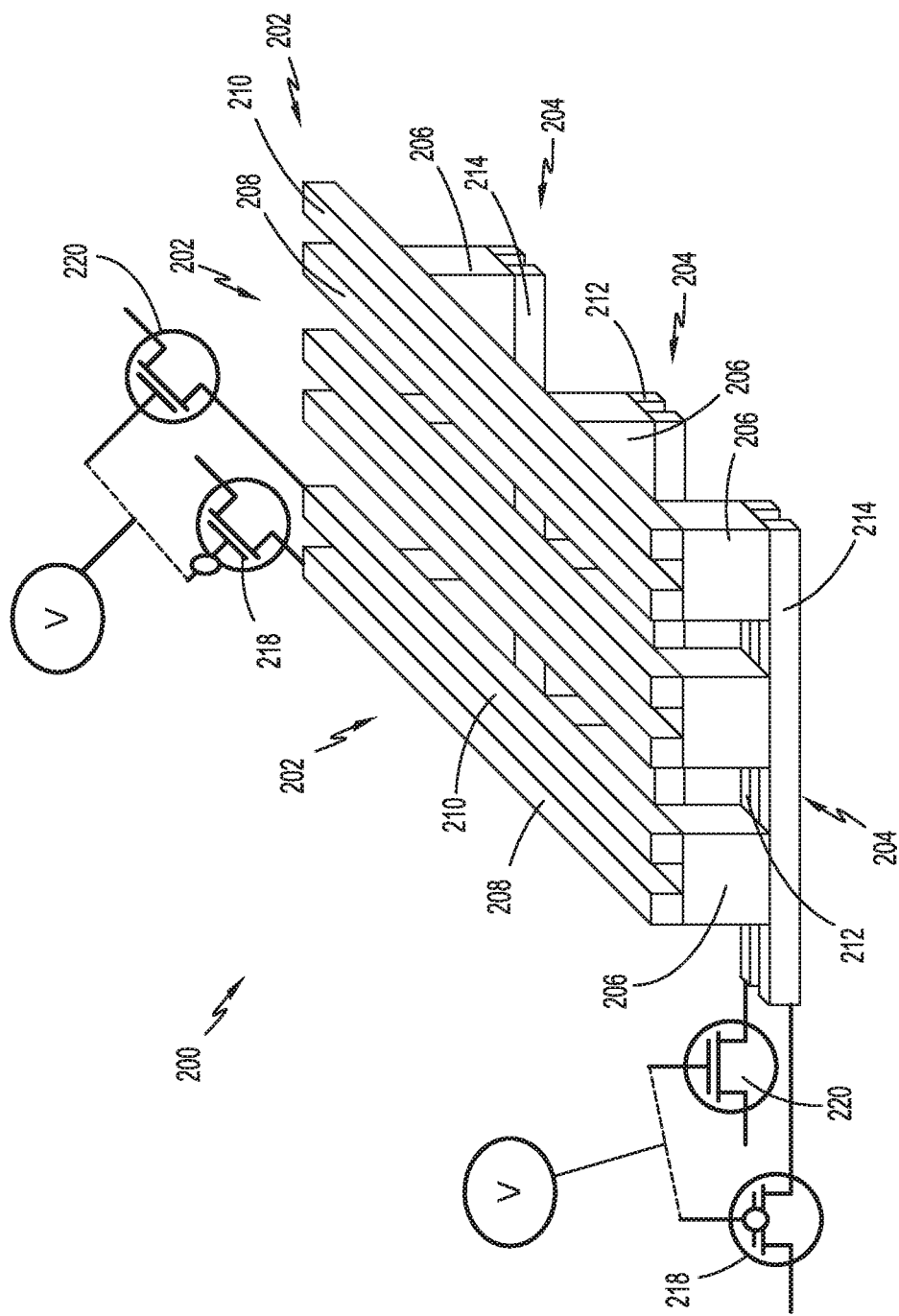
FIG. 3 is a schematic view of another illustrative embodiment of a cross-bar array system for use with the neuromorphic device architecture of FIG. 1.

Referring now to FIG. 3, another illustrative embodiment of the present disclosure is illustrated. In accordance with this illustrative embodiment, a pMOS transistor 218 is coupled to the row write line 208 and an nMOS transistor 220 is coupled to the row read line 210. An nMOS transistor 220 is coupled to the column write line 212 and a pMOS transistor 218 is coupled to the column read line 214, i.e., an opposite setup to the row write and row read lines 208, 210. In addition, a single voltage source "V" is coupled to the row write and row read lines 208, 210 of the row rail 202 and a single voltage source "V" is coupled to the column write and column read lines 212, 214 of the column rail 204. In this illustrative embodiment, the voltage selection options include:

1. $V_{SELECT}=0$—to close off the respective pMOS transistors 218 or nMOS transistors 220;
2. $V_{SELECT}>0$—to perform a write function to the RPU cell 206; and
3. $V_{SELECT}<0$—to perform a read function on the RPU cell 206.

When performing a write function to the RPU cell 206, the $V_{SELECT}$ of the voltage source "V" coupled to the row write and read lines 208, 210 is selected to be a positive V+ voltage source. Thus, when $V_{SELECT}$ is positive, the nMOS transistor 220 is in a closed state to prevent current flow through the row read line 210. In turn, the pMOS transistor 218 assumes an open state permitting current to flow through the row write line 208 to perform a write function on the RPU cell 206.

As noted hereinabove, the column rail 204 has the opposite transistor setup. The column write line 212 is coupled to an nMOS transistor 220 while the column read line 214 is coupled to a pMOS transistor 218. When $V_{SELECT}$ is positive, the nMOS transistor 220 assumes an open state to allow current to flow through the column write line 212, while the pMOS transistor 218 is in a closed state to clamp-off the column read line 214. In this manner, with a positive $V_{SELECT}$, the column write line 212 will allow current flow and drop the voltage across the write electrodes to perform a write function on the RPU cell 206 while no current will flow through the column read line 214.

When conducting a read function on the RPU cell 206, the $V_{SELECT}$ of the voltage source "V" to either the row rail 202 and/or the column rail 204 is selected to be a negative V– voltage source. With a negative $V_{SELECT}$ applied to the row rail 202, the nMOS transistor 220 coupled to the row read line 210 assumes an open state to allow current flow to perform a read function on the RPU cell 206. The pMOS transistor 218 assumes a closed state. Similarly, with a negative $V_{SELECT}$ applied to the column rail 204, the pMOS transistor 218 coupled to the column read line 214 assumes an open state to allow current flow to perform a read function on the RPU cell 206. The nMOS transistor 220 coupled to the column write line 212 will assume a closed state. It is noted that all other row and column rails lines should have $V_{SELECT}=0$, which will clamp those lines and ensure no current flows through unselected lines/devices. In an alternative embodiment, the pMOS and nMOS transistors 218, 220 respectively coupled to the row write and row read lines 208, 210 may be switched, and the nMOS and pMOS transistors 220, 218 respectively coupled to the column write and column read lines 212, 214 may be switched. The $V_{SELECT}$ will also be switched whereby a negative $V_{SELECT}$ results in a write function performed on the RPU cell 206 and a positive $V_{SELECT}$ results in a read function on the RPU cell 206.

Figure 4:
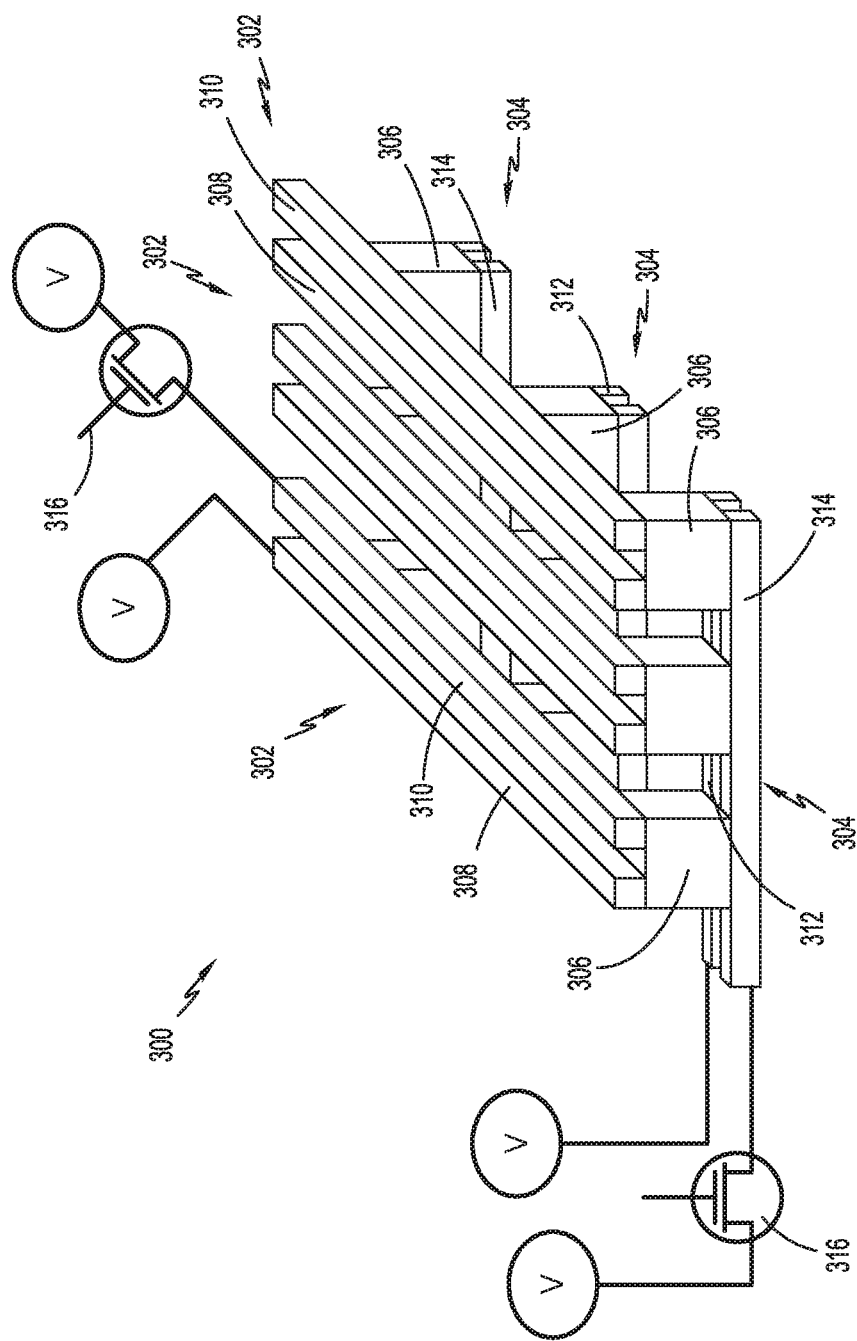
FIG. 4 is a schematic view of an illustrative embodiment of a cross-bar array system for use with the neuromorphic device architecture of FIG. 1.

Referring now to FIG. 4, another illustrative embodiment of the present disclosure is illustrated. Similar to the prior illustrative embodiments, the cross-bar system 300 includes row and column rails 302, 304 interconnected by RPU cells 306. Each row rail 302 includes a row write line 308 and a row read line 310 while each column rail 304 includes a column write line 312 and a column read line 314. However, the write lines 308, 312 and the read lines 310, 314 comprise different materials. More specifically, the row and column write lines 308, 312 are fabricated from a material having a greater resistivity than the material from which the row read line and the column read lines 310, 314 are fabricated. For example, the row and column write lines 308, 312 may comprise titanium nitride (TiN) and/or tantalum nitride (TaN) while the row read and column read lines 310, 314 may comprise copper (Cu), cobalt (Co), ruthenium (Ru), or tungsten (W). In addition, an nMOS transistor 316 is coupled to each of the row read line 310 and column read line 314. One or more voltage sources "V" with designated circuitry and logic is coupled to each of the row write line 308, row read line 310, column write line 312 and column read line 314.

In conjunction with performing a write/modify function to the RPU cells 306, the nMOS transistor 316 coupled to each of the row read line 310 and the column read line 314 are in a closed state to correspondingly close or "clamp down" the row and column read lines 310, 314, i.e., no voltage is supplied to the nMOS transistors 316. A voltage, via the voltage sources V, is supplied to the row and column write lines 308, 312 and a current, at the appropriate levels, is carried through these lines 308, 312 to write/modify the respective RPU cells 306.

In conjunction with performing a read function, a positive voltage is supplied from each voltage source "V" to the nMOS transistors 316 to open the nMOS transistors 316. A resulting current, at specified levels controlled through the logic or circuitry associated with the voltage sources "V," is conveyed along the row and column read lines 310, 314 to perform one or more read functions on the respective RPU cell 306. Due to the relative high resistivity of the material of fabrication of the row write and column write lines 308, 312, cross-talk current between the read lines 310, 314 and the write lines 308, 312 is minimized. More specifically, the high resistance material of the row and column write lines 308, 312 substantially impedes current flow or drift along these lines 308, 312, which would otherwise occur as a product of cross-talk between the read lines 310, 314 and the write lines 308, 312.

It is to be understood that the embodiments discussed herein are not limited to the particular materials, features, and processing steps shown and described herein. In particular, with respect to the processing steps, it is to be emphasized that the descriptions provided herein are not intended to encompass all of the processing steps that may be required to form a functional semiconductor integrated circuit device.

It is to be understood that the methods discussed herein can be incorporated in various semiconductor process flows to fabricate cross-bar array structures (or other memory arrays which comprise resistive memory cells that require electroforming), in conjunction with integrated circuits having analog and digital circuitry or mixed-signal circuitry. In particular, integrated circuit dies can be fabricated with various devices such as FinFET devices, bipolar transistors, metal-oxide-semiconductor transistors, diodes, capacitors, inductors, etc. An integrated circuit can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques described herein according to embodiments of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A non-volatile memory cross-bar array system, which comprises:
   a set of conductive row rails;
   a set of conductive column rails configured to form a plurality of crosspoints at intersections between the conductive rails and the conductive column rails;
   a resistive processing unit at each of the crosspoints, the resistive processing units each representing a neuron in a neural network;
   at least one given conductive row rail including first and second row lines in contact with a given resistive processing unit; and
   at least one given conductive column rail including first and second column lines in contact with the given resistive processing unit.

2. The cross-bar array system of claim 1 wherein:
   the first row line is a dedicated row write line and the second row line is a dedicated row read line; and
   the first column line is a dedicated column write line and the second column line is a dedicated column read line.

3. The cross-bar array system of claim 2 including a first transistor coupled to each of the row write line and the column write line, the first transistors configured to control flow of current through the row write line and the column write line.

4. The cross-bar array system of claim 3 including a second transistor coupled to each of the row read line and the column read line, the second transistors configured to control flow of current through the row read line and the column read line.

5. The cross-bar array system of claim 2 including:
a pMOS transistor coupled to one of the row write line and the row read line of the at least one given row rail;
an nMOS transistor coupled to the other of the row write line and the row read line;
an nMOS transistor coupled to the one of the column write line and the column read line of the at least one given column rail; and
a pMOS transistor coupled to the other of the column write line and the column read line.

6. The cross-bar array system of claim 5 wherein:
one of the row write line and the column write line is coupled to a pMOS transistor and the other of the row write line and the column write line is coupled to an nMOS transistor; and
one of the row read line and the column read line is coupled to a pMOS transistor and the other of the row read line and the column read line is coupled to an nMOS transistor.

7. The cross-bar array system of claim 2 wherein:
the row write line and the column write line comprise a first material having a first level of resistivity; and
the row read line and the column read line comprise a second material having a second level of resistivity less than the first level of resistivity.

8. The cross-bar array system of claim 7 including a transistor coupled to each of the of the row read line and the column read line.

9. The cross-bar array system of claim 2 wherein:
each of the conductive row rails include a row write line and a row read line in contact with individual ones of the resistive processing units and wherein each of the column rails include a column write line and a column read line in contact with individual ones of the resistive processing units.

10. The cross-bar array system of claim 1 wherein the resistive processing unit cells comprise random access memory devices.

11. A non-volatile memory cross-bar array system, comprises:
a set of conductive row rails, each conductive rail including a pair of row lines;
a set of conductive column rails configured to form a plurality of crosspoints at intersections between the conductive row rails and the conductive column rails, each column rail including a pair of column lines; and
a matrix of resistive processing unit cells, individual resistive processing unit cells being electrically connected at respective crosspoints to electrically couple with respective row rails and column rails;
wherein a given resistive processing unit cell comprises a four terminal memory device.

12. The cross-bar array system of claim 11 wherein:
at least one given conductive row rail includes a row write line and a row read line in contact with the given resistive processing unit cell; and
at least one given conductive column rail includes a column write line and a column read line in contact with the given resistive processing unit cell.

13. The cross-bar array system of claim 12 including:
one or more transistors to selectively control flow of current through the row write line and the column write line; and
one or more transistors to selectively control flow of current through the row read line and the column read line.

14. The cross-bar array system of claim 13 including:
a pMOS transistor coupled to one of the row write line and the row read line of the at least one given row rail;
an nMOS transistor coupled to the other of the row write line and the row read line;
an nMOS transistor coupled to the one of the column write line and the column read line of the at least one given column rail; and
a pMOS transistor coupled to the other of the column write line and the column read line.

15. The cross-bar array system of claim 14 wherein:
one of the row write line and the column write line is coupled to a pMOS transistor and the other of the row write line and the column write line is coupled to an nMOS transistor; and
one of the row read line and the column read line is coupled to a pMOS transistor and the other of the row write line and the column write line is coupled to an nMOS transistor.

16. The cross-bar array system of claim 12 wherein:
the row write line and the column write line comprise a first material having a first level of resistivity; and
the row read line and the column read line comprise a second material having a second level of resistivity less than the first level.

17. The cross-bar array system of claim 16 including a transistor coupled to each of the row read line and the column read line to selectively prevent current from flowing through the row read line and the column read line.

18. A non-volatile memory cross-bar array system, which comprises:
a set of conductive row rails;
a set of conductive column rails configured to form a plurality of crosspoints at intersections between the conductive rails and the conductive column rails;
a resistive processing unit at each of the crosspoints, the resistive processing units each representing a neuron in a neural network;
at least one given conductive row rail including a row write line and a row read line in contact with a given resistive processing unit;
at least one given conductive column rail including a column write line and a column read line in contact with the given resistive processing unit;
wherein the row write line and the column write line comprise a first material having a first level of resistivity; and
wherein the row read line and the column read line comprise a second material having a second level of resistivity less than the first level.

19. The cross-bar array system of claim 18 including a transistor coupled to each of the of the row read line and the column read line.

20. The cross-bar array system of claim 19 wherein the transistor is an nMOS transistor.

* * * * *